(12) United States Patent
Bartsch et al.

(10) Patent No.: US 6,468,890 B2
(45) Date of Patent: Oct. 22, 2002

(54) SEMICONDUCTOR DEVICE WITH OHMIC CONTACT-CONNECTION AND METHOD FOR THE OHMIC CONTACT-CONNECTION OF A SEMICONDUCTOR DEVICE

(75) Inventors: Wolfgang Bartsch, Erlangen; Reinhold Schörner, Grossenseebach; Dietrich Stephani, Bubenreuth, all of (DE)

(73) Assignee: Siced Electronics Development GmbH & Co. KG, Erlangen (DE)

( * ) Notice: Subject to any disclaimer, the term of this patent is extended or adjusted under 35 U.S.C. 154(b) by 0 days.

(21) Appl. No.: 09/799,866

(22) Filed: Mar. 2, 2001

(65) Prior Publication Data

US 2001/0023124 A1 Sep. 20, 2001

Related U.S. Application Data

(63) Continuation of application No. PCT/DE99/02616, filed on Aug. 20, 1999.

(30) Foreign Application Priority Data

Sep. 2, 1998 (DE) .......................... 198 39 969
Apr. 30, 1999 (DE) .......................... 199 19 905

(51) Int. Cl.[7] .......................... H01L 21/44; H01L 23/48
(52) U.S. Cl. .................. 438/597; 438/603; 438/105; 257/743
(58) Field of Search ................. 438/105, 597, 438/602, 603, 660, 649, 651, 655, 656, 682, 683; 257/741, 743, 761, 770

(56) References Cited

U.S. PATENT DOCUMENTS 3,510,733 A 5/1970 Addamiano
5,502,003 A 3/1996 Ogino et al.
5,739,554 A * 4/1998 Edmond et al. ............ 257/103

OTHER PUBLICATIONS

J. Crofton et al.: "The Physics of Ohmic Contacts of SiC", phys. stat. sol. (b), No. 202, 1997, pp. 581–603.

Lisa M. Porter et al.: "A critical review of ohmic and rectifying contacts for silicone carbide", Materials Science and Engineering vol. 43, 1995, pp. 83–105.

G. L. Harris et al.: "Ohmic contacts of SiC", in "Properties of Silicone Carbide", 1995, INSPEC, London.

C. Hallin et al.: "Interface chemistry and electrical properties of annealed Ni and Ni/Al–6H SiC structures", Inst. Phys. Conf. Ser. No. 142, Chapter 3, 1995, pp. 601–604.

J. Crofton et al.: "High–temperature ohmic contact to n–type 6H–SiC using nickel", J. Appl. Phys. vol. 77 No. 3, Feb. 1, 1995, pp. 1317–1319.

* cited by examiner

Primary Examiner—Tuan H. Nguyen
(74) Attorney, Agent, or Firm—Laurence A. Greenberg; Werner H. Stemer; Ralph E. Locher

(57) ABSTRACT

The disclosed semiconductor device comprises an ohmic contact between a semiconductor region made of n-conducting silicon carbide and a largely homogeneous ohmic contact layer (110), which adjoins the semiconductor region and is made of a material having a first and a second material component. A silicide formed from the first material component and the silicon of the silicon carbide and a carbide formed from the second material component and the carbon of the silicon carbide are contained in a junction region between the semiconductor region and the ohmic contact layer. The silicide and carbide formation take place at maximum 1000° C.

24 Claims, 1 Drawing Sheet

SEMICONDUCTOR DEVICE WITH OHMIC CONTACT-CONNECTION AND METHOD FOR THE OHMIC CONTACT-CONNECTION OF A SEMICONDUCTOR DEVICE

CROSS-REFERENCE TO RELATED APPLICATION

This application is a continuation of copending International Application No. PCT/DE99/02616, filed Aug. 20, 1999, which designated the United States.

BACKGROUND OF THE INVENTION

Field of the Invention

The invention relates to a semiconductor device with ohmic contact-connection and also to a method for the ohmic contact-connection of a semiconductor device.

The invention relates, in particular, to a semiconductor device which is composed of silicon carbide (SiC) at least in a semiconductor region which is contact-connected.

Silicon carbide in monocrystalline form is a semiconductor material having outstanding physical properties. On account of its high breakdown field strength, SiC is a semiconductor material of interest, inter alia, particularly for power electronics, even for applications in the kV range. Owing to the large energy gap, which also enables emission or detection of short-wave light in the blue or ultraviolet spectral region, SiC also constitutes a promising semiconductor material for optoelectronics.

Since the commercial availability of wafers made of monocrystalline silicon carbide, in particular of the 6H and 4H polytypes, and also the technological understanding of SiC have increased, SiC components are now also receiving more and more attention. Thus, a description has already been given e.g. of a Schottky diode, a pn diode, various transistors such as a MOSFET (Metal Oxide Semiconductor Field Effect Transistor), a MESFET (Metal Semiconductor Field Effect Transistor) or a JFET (Junction Field Effect Transistor), but also an LED (Light Emitting Diode), a laser diode or a photodetector, in each case based on silicon carbide.

In each case at least one stable ohmic contact on a semiconductor region made of SiC is required for the functioning of these components. This at least one ohmic contact is situated e.g. on a back side of the wafer. In this case, the lowest possible contact resistance in conjunction with the smallest possible contact area is sought in order to avoid undesirable losses at the semiconductor-metal junction.

The review articles "Ohmic contacts to SiC" by G. L. Harris et al. from "Properties of Silicon Carbide" ed. by G. L. Harris INSPEC, 1995, pages 231–234 and "A critical review of ohmic and rectifying contacts for silicon carbide" by L. M. Porter and R. F. Davis, Materials Science and Engineering, B34, 1995, pages 83–105 contain summaries of contact-connection methods for silicon carbide of different polytypes and conduction types. Accordingly, nickel has been used the most often hitherto as a contact material for an ohmic contact on n-conducting SiC. After the nickel material has been applied, a heat-treatment process for forming the ohmic contact is usually performed at a process temperature of above 900° C. The lowest documented contact resistance for n-conducting SiC is $1 \cdot 10^{-6}$ $\Omega cm^2$. In this embodiment, the nickel contact is heat-treated for five minutes at 1000° C. However, the substrate which has undergone ohmic contact-connection is composed of n-conducting 6H—SiC having a high dopant concentration of $4.5 \cdot 10^{20}$ $cm^{-3}$, which is not very practicable. The nickel contact is situated on the (000$\bar{1}$) face, i.e. on the carbon face, of the 6H—SiC substrate.

U.S. Pat. No. 3,510,733 describes an ohmic contact between a lead wire and a semiconductor region made of n-conducting silicon carbide. The lead wire is composed either of pure chromium or of 20% chromium and 80% nickel or of 15% chromium, 60% nickel and 25% iron or of stainless steel with a material portion of from 11 to 20% chromium, up to 12% nickel, up to 2% magnesium, up to 1% silicon, up to 0.3% carbon and with a main proportion of iron. The main requirement placed on the material of the lead wire and of the ohmic contact is sufficient ductility and resistance to oxidation even at a high temperature. Connecting the cross-sectional area of the lead wire to the semiconductor region results in a punctiform contact delimited, in particular, by the wire geometry, such as e.g. diameter. The lead wires used have a diameter of 0.0508 mm and 0.127 mm. The ohmic connection between the lead wire and the semiconductor region made of silicon carbide is achieved by heating above the melting point of the materials used. These temperatures lie between 1500 and 1900° C. However, the process conditions during the production of a semiconductor device made of silicon carbide often limit a maximum permissible process temperature for achieving an ohmic contact to a distinctly lower value.

SUMMARY OF THE INVENTION

It is accordingly an object of the invention to provide a semiconductor device with ohmic contact-connection and method for the ohmic contact-connection of a semiconductor device that overcomes the above-mentioned disadvantages of the prior art methods and devices of this general type, in which the favorable properties of silicon carbide are utilized to practical advantage and the contact-connection of n-conducting SiC is improved in comparison with the prior art.

It is also an object of this invention, to provide a method for the ohmic contact-connection of a semiconductor device that overcomes the above-mentioned disadvantages of the prior art methods and devices of this general type. In particular, the contact on the semiconductor region is intended to be heated during the heat-treatment process to a lower process temperature than in the prior art, but at least a comparable contact resistance to that in the prior art is nonetheless intended to be achievable.

With the foregoing and other objects in view there is provided, in accordance with the invention a semiconductor device with ohmic contact-connection comprising at least a semiconductor region made of n-conducting silicon carbide, adjoining the semiconductor region a largely homogeneous ohmic contact layer made of a material having a first component able to form a silicide at a process temperature of at most 1000° C., and a second component able to form a carbide at a process temperature of at most 1000° C., and a junction region extending into the semiconductor region and into the ohmic contact layer, containing a silicide formed from the first component and the silicon of the silicon carbide and a carbide formed from the second component and the carbon of the silicon carbide.

With the foregoing and other objects in view there is provided, in accordance with the invention, a method for the contact-connection of a semiconductor device which comprises applying a largely homogeneous ohmic contact layer made of a material having a first component able to form a silicide and a second component able to form a carbide to a semiconductor region made of n-conducting silicon carbide, the two material components being applied simultaneously, and subjecting the structure comprising semiconductor region and ohmic contact layer to a heat-treatment process with heating to a process temperature of at most 1000° C., whereby a silicide is formed from the first material component and the silicon of the silicon carbide, and a carbide is formed from the second material component and the carbon of the silicon carbide, in a junction region extending into the semiconductor region and into the ohmic contact layer.

The invention is based on finding that it is possible to produce a stable ohmic contact to a semiconductor region made of n-conducting silicon carbide with very low contact resistance from a material comprising two material components, if one material component forms a silicide with the silicon of the silicon carbide and the other material component forms a carbide with the carbon of the silicon carbide. Consequently, a quaternary material system comprising the silicon and the carbon of the silicon carbide and also the two material components is present in the junction region extending both into the semiconductor region and into the ohmic contact layer. Consequently, after severing of the atomic bond between the silicon and the carbon of the silicon carbide at an elevated temperature, there is available for each of the two elements a new bonding partner with which a silicide and a carbide, respectively, can be formed.

This silicide and carbide formation essentially takes place during the heat-treatment process which is carried out after applying the material. However, it is also the case that initial nucleation for the silicide and the carbide can already occur even during the material application depending on the prevailing process conditions (deposition temperature, energy content of material particles produced by sputtering) at the interface with the SiC.

In the case of a pure nickel contact in accordance with the prior art, nickel silicide is formed during the heat-treatment process. In this case, however, carbon atoms then remain in the junction region on account of the stoichiometric ratio between silicon and carbon in the silicon carbide. These atoms then form graphite inclusions with relatively poor conductivity. This results in an unfavorable influence on the ohmic contact behavior. According to the invention, in contrast, this is improved by providing a bonding partner for the formation of a carbide from the carbon atoms.

Since the silicide and carbide formation essentially take place during the heat-treatment process, it is helpful if both the first and the second material components are already situated at the interface with the semiconductor region to a sufficient extent before the beginning of the heat-treatment process. This is advantageously achieved by both material components being applied simultaneously. In this case, the material may be present in the form of a mixture, a batch, an alloy or a compound of these two material components as a practically homogeneous layer on the semiconductor region. The silicide and the carbide can then be formed at any time in the heat-treatment process, in particular also immediately after the start of the heat treatment.

The two material components are advantageously chosen such that the silicide and the carbide are formed during the heat-treatment process at a maximum process temperature of at most 1000° C. With this process temperature, it is then typically possible to achieve a contact resistance of the order of magnitude of $1 \cdot 10^{-7}$ $\Omega cm^2$. As a result, the best contact resistance mentioned in the prior art is improved approximately by one order of magnitude.

After the heat-treatment process, a slightly inhomogeneous material composition will be present within the contact layer. This stems from exchange processes between the individual material components in the junction region. Specifically, the silicide and carbide formation in this case result in an exchange of atoms which were originally assigned to the semiconductor region and the ohmic contact layer, which was initially applied in a practically homogeneous manner. After the conclusion of the heat-treatment process, it is thus the case that, depending on the process control chosen, in the junction region the ohmic contact layer deviates from the homogeneous material composition present in the remaining region of the ohmic contact layer. The expression "largely homogeneous ohmic contact layer" should therefore then be understood such that this inhomogeneity is concomitantly included.

Moreover, differences in the material composition which are to be attributed to customary contamination in starting substances are likewise regarded as non-critical here.

The ohmic contact-connection according to the invention can advantageously be used for a semiconductor device made of silicon carbide in a wide variety of embodiments. Possible embodiments of an SiC semiconductor device are e.g. a Schottky diode, a pn diode, a MOSFET, a MESFET, a JFET, an LED, a laser diode or a photodetector. Further embodiments are likewise possible.

Particular refinements of the semiconductor device and of the method according to the invention emerge from the respective dependent claims.

In a preferred embodiment, the second material component is present with a proportion by volume of from 2 to 50% in the material. A proportion of from 10 to 30% is particularly preferred.

To form a good ohmic contact, it is advantageous if the n-conducting semiconductor region has a sufficiently high dopant concentration at least at the interface with the ohmic contact layer. The dopant concentration preferably lies between $10^{17}$ $cm^{-3}$ and $10^{20}$ $cm^{-3}$. A particularly good ohmic contact results if the dopant concentration is at least $10^{19}$ $cm^{-3}$. Nitrogen or phosphorus are used as dopant in the n-conducting semiconductor region.

An embodiment in which the two material components form the silicide and the carbide at a process temperature as low as 900° C., or even below 900° C., is advantageous. As a result, the temperature during the heat treatment can be reduced compared with the prior art, without this being associated with a loss in the contact resistance that can be achieved. A contact resistance of at most $5 \cdot 10^{-7}$ $\Omega cm^2$ can be achieved in a simple manner with a process temperature of approximately 900° C. At a process temperature that is reduced further, for example 850° C., a contact resistance of the order of magnitude of $1 \cdot 10^{-6}$ $\Omega cm^2$ is still obtained.

In another advantageous refinement, the first material component is composed of nickel (Ni) or cobalt (Co). A variant in which the second material component is iron (Fe), tungsten (W), vanadium (V) or tantalum (Ta) is additionally favorable. These materials are silicide- or carbide-forming materials, so that they constitute particularly suitable contact materials for the semiconductor device. Preferred material combinations are permalloy (NiFe) or a cobalt/iron (CoFe) alloy.

The ohmic contact layer preferably has a thickness in the range from 15 to 200 nm. A material application having such a thickness can be realized without difficulty. At the same time, this contact layer thickness ensures that there is a sufficient quantity of the two material components for the formation of silicide and carbide. A good ohmic characteristic of the contact is obtained in this way. In an advantageous manner, the contact layer is at least thick enough that the further processing steps can be performed on the contact layer. On the other hand, the time and expense required place upper limits on the thickness. A material application with a thickness of 100 nm effected by sputtering lasts about 20 minutes. Moreover, the contact layer is at most so thick that a possible downstream lift-off process step is still possible without special precautions.

The n-conducting semiconductor region that is to be contact-connected can comprise different SiC polytypes. There are embodiment variants in which α-SiC e.g. in the form of 6H—, 4H—, or 15R-SiC or β-SiC in the form of 3C—SiC is used for the n-conducting semiconductor region. However, other polytypes are likewise possible.

An α-Sic single crystal has two mutually opposite crystal faces which are particularly distinguished by the crystal geometry and are usually designated by (0001)—or silicon-face and by (000$\bar{1}$)—or carbon-face. There is, then, an embodiment of the semiconductor device in which the ohmic contact layer is arranged on the (0001) face of an n-conducting α-SiC semiconductor region, and also another embodiment in which the ohmic contact layer is situated on the (000$\bar{1}$) face. The contact layer made of a silicide- and a carbide-forming material component, in particular a contact layer made of a nickel/iron alloy, has the particular property that, in contrast to the pure nickel contact layer used inter alia in the prior art, it leads to an equally good contact behavior both on the (0001) face and on the (000$\bar{1}$) face.

Outside the n-conductor semiconductor region, the semiconductor device may also be composed, at least in some regions, of a material other than SiC, for example of silicon (Si) or gallium arsenide (GaAs). A vertical LED or laser diode can also comprise a light-emitting gallium nitride (GaN) layer structure on an n-conducting SiC substrate. On that side of the SiC substrate which is remote from the light-emitting GaN layer structure, an ohmic contact is required via which an electric current can be fed into the light-emitting layer structure.

In a further advantageous embodiment of the semiconductor device, a covering layer is situated on a side of the ohmic contact layer which is remote from the n-conducting SiC semiconductor region. Such a covering layer can also have a protective function. It covers the contact layer and thereby protects the latter against an undesirable influence during a further process step—optionally taking place after the ohmic contact-connection—for fabricating the semiconductor device. Thus, e.g. during a subsequent treatment with hydrofluoric acid, the covering layer prevents a direct contact and thus a chemical reaction of the contact layer with the hydrofluoric acid.

The covering layer therefore contains, in particular, a metallic material which, moreover, is preferably chemically inert with respect to an aggressive substance used, for instance, in a subsequent process step. In addition, the metal used is practically stable, chemically and physically, both at the process temperature of the heat-treatment process and at a temperature of a subsequent further treatment. During each of these further treatments, the temperature is always below the process temperature of the heat-treatment process. Tungsten (W), tantalum (Ta) or zirconium (Zr) are suitable metals, for example, in this connection. The covering layer preferably has a thickness from 50 to 250 nm. In this thickness range, the covering layer is sufficiently impervious to the aggressive substances.

Advantageous embodiments of the method, which emerge from the corresponding subclaims, have essentially the same advantages as the abovementioned respectively corresponding embodiments of the semiconductor device itself.

Other refinements of the method relate to the application of the material to the n-conducting semiconductor region and to the heat-treatment process.

In one refinement of the method, the material which is applied to the semiconductor region is taken from two separate sources. In this case, the sources each contain one of the two material components. They are taken by simultaneous vaporization or sputtering. The contact layer is formed by depositing the two material components on the n-conductor semiconductor region. In this case, the material of the contact layer is produced either while still in the vapor phase from the two material components, in the course of the deposition process, or not until afterward. Appropriately set process parameters can ensure that a specific intended mixing ratio of the two material components is adhered to.

In this case, the sputtering from two separate sources, can be effected in such a way that, alternately in a short time sequence, in each case only one of the two material components from the associated source is sputtered and deposited as a monofilm on the n-conducting semiconductor region. The resulting monofilms are very thin. They have, in particular, just a thickness of the order of magnitude of a few Ångströms. In the extreme case, such a monofilm may also consist just of a single atomic layer, a so-called monolayer. On account of the small layer thickness and the short time sequence in the course of the layer deposition, this material application of the two material components is also designated as simultaneous here. Mixing together of the atoms of these monolayers (homogenization) then takes place, depending on the process conditions, at least in part already during the application process itself or right at the beginning of the subsequent heat-treatment process. On account of the small layer thickness, this mixing-together process lasts only a very short time.

By contrast, an alternative refinement provides for first preparing a source material (alloy target) from the first and second material components to be then sputtered in a second method step. The released particles of the source material are then deposited as contact layer on the n-conducting SiC semiconductor region, as in the previously described refinement. Vaporization of the source material from the alloy source is likewise possible.

In an advantageous embodiment variant, the semiconductor device is heated during the heat-treatment process to a process temperature of at most 900° C., in particular to about 850° C. This process temperature is then preferably kept approximately constant for up to two hours, in particular for two minutes. Specifically, the heat-treatment process can, if required, also be carried out at a lower temperature, such as e.g. at 800° C., but in return over a longer period of time, e.g. 30 minutes. A considerably longer heat-treatment time in the region of several hours is also possible. On the other hand, the heat-treatment process can, however, also consist only of a heating phase and an immediately following cooling phase, without a hold time at a process temperature being provided in between. The heating and cooling operation is preferably carried out using a so-called RTP (Rapid Thermal Processing) installation or using a so-called RIA (Rapid Isothermal Annealing) installation. The heat-treatment process serves for the ohmic forming of the contact layer. It has been found that a thermally stable contact with good ohmic characteristics and a low contact resistance results on the n-conducting SiC after this heat-treatment process.

A further refinement, in which the heat-treatment process takes place with the exclusion of oxygen, in particular in an inert gas atmosphere, is additionally favorable. A possible inert gas is argon (Ar) or helium (He), for example. However, nitrogen (N) or hydrogen (H) can also advantageously be used for producing the oxygen exclusion. Oxygen is undesirable owing to its high reactivity in particular with the iron of a nickel/iron alloy optionally used for the contact layer.

Other features which are considered as characteristic for the invention are set forth in the appended claims.

Although the invention is illustrated and described herein as embodied in a semiconductor device with ohmic contact-connection and method for the ohmic contact-connection of a semiconductor device, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

Mutually corresponding parts are provided with the same reference symbols in FIGS. 1 and 2.

DESCRIPTION OF THE PREFERRED EMBODIMENTS

Figure 1:
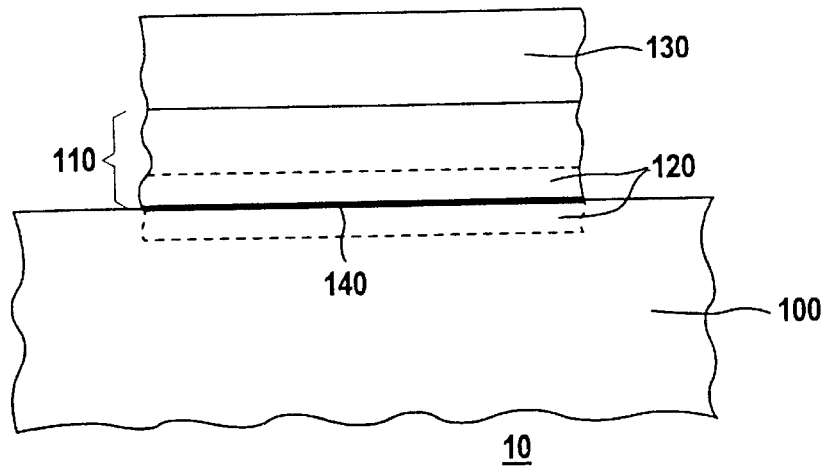
FIG. 1 shows a semiconductor device having an n-conducting SiC semiconductor region and an adjoining contact layer.

The semiconductor device 10 shown in FIG. 1 comprises an n-conducting semiconductor region 100 made of 6H—SiC, on whose (0001) face an ohmic contact layer 110 is disposed. The detail of the semiconductor device 10 which is shown in FIG. 1 can in this case be part of a larger component, for example in the form of a pn diode, a Schottky diode, a laser diode or an LED. An ohmic contact to the n-conducting SiC semiconductor region 100 is necessary in each case. In particular, the illustrated detail of the semiconductor device 10 can also be adjoined by further semiconductor regions having a different conduction type and/or different dopant concentration.

The n-conducting semiconductor region 100 illustrated is doped with a high proportion of donors, with nitrogen in the present case. The dopant concentration is about $5 \cdot 10^{19}$ cm$^{-3}$. This promotes the formation of a good ohmic contact on the semiconductor region 100.

The contact layer 110 is composed of a material having a first and a second material component. In this case, the first material component is nickel, and the second component is iron. The material of the ohmic contact layer 110 constitutes, in particular, an alloy known by the name permalloy. In this case, the proportion by volume of nickel is 82%, and that of iron 18%.

For the ohmic contact-connection of the n-conducting semiconductor region 100, a permalloy alloy is particularly advantageous since the nickel of the ohmic contact layer 110 can form a nickel silicide with the silicon of the semiconductor region 100 and the iron of the ohmic contact layer 110 can form an iron carbide with the carbon of the semiconductor region 100. In this case, the silicide and carbide formation take place, in particular, in a junction region 120 extending into the semiconductor region 100 and the ohmic contact layer 110.

By contrast, if carbide formation with the second material component were not possible, then this would lead to a larger proportion of graphitized carbon in the junction region 120 during nickel silicide formation that nevertheless occurs. The graphitized carbon forms e.g. unordered inclusions in the junction region 120, which have a comparatively poor conductivity owing to the graphite. Many graphite inclusions of this type thus bring about an ohmic contact behavior which, overall, is less favorable. Therefore, it is advantageous if, as in the semiconductor device 10 considered, the second material component and the carbon also form a carbide and the graphitization is thus at least reduced.

The material of the ohmic contact layer 110 is first applied to the semiconductor region 100 by sputtering from an FeNi source (alloy target) (not shown). To that end, FeNi material particles released from the FeNi source are deposited on the semiconductor region 100. At an interface 140 with the semiconductor region 100, both nickel and iron atoms are then present in accordance with the chosen mixture ratio of the permalloy in the alloy target. The contact layer 110 thus applied has a practically homogeneous material composition across the entire layer thickness.

After the permalloy layer has been applied to the semiconductor region 100, a quaternary material system is thus present at the interface 140 with the semiconductor region 100, in which system each of the two material components of the permalloy layer is assigned an element of the semiconductor region 100 as a potential new bonding partner during a subsequent heat-treatment process.

In order to afford protection against the influence of a process atmosphere in a processing operation downstream of the contact-connection process, a covering layer 130 is disposed on the ohmic contact layer 110. However, even during the heat-treatment process the covering layer 130 can also afford protection against an undesirable action of oxygen on the ohmic contact layer 110 if the inert gas atmosphere that is usually used does not ensure one-hundred-percent exclusion of oxygen. In this case, the covering layer 130 is composed of tungsten, which has a high melting point and is chemically inert with respect to the process gases that are usually present. The contact layer 110 and the covering layer 130 each have a layer thickness of about 100 nm. The contact layer 110 and the semiconductor region 110 form an area contact having dimensions of up to a few square centimeters. If required, however, a complete wafer surface can also undergo ohmic contact-connection.

After the application of the ohmic contact layer 110 and the covering layer 130, the semiconductor device 10 is subjected to a heat-treatment process at about 850° C., lasting approximately two minutes, for the purpose of forming the ohmic contact. During this heat-treatment process, the nickel silicide and the iron carbide are formed in the junction region 120. A contact resistance of about $1 \cdot 10^{-6}$ $\Omega$cm$^2$ is produced between the n-conducting semiconductor region 100 and the contact layer 110. If the heat-treatment process is carried out a process temperature of about 1000° C., then a contact resistance of $1 \cdot 10^{-7}$ $\Omega$cm$^2$ can thus be achieved.

The silicide and carbide formation results, during the heat treatment, in a slightly different material composition in the junction region 120 than in the remaining region of the contact layer 110, in which the homogeneity originally present is preserved even after the heat treatment.

Figure 2:
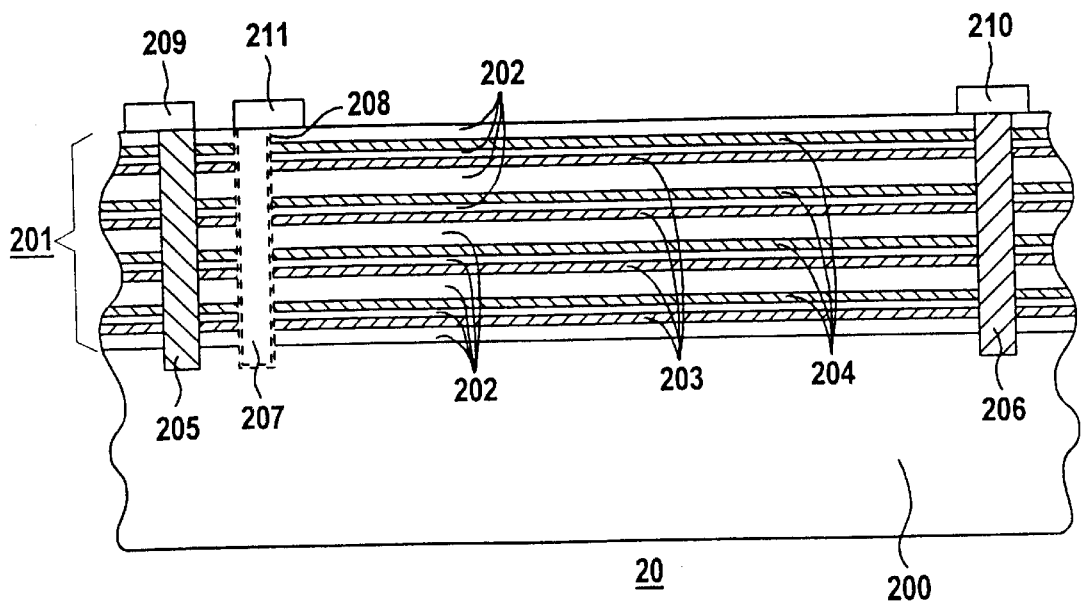
FIG. 2 shows a semiconductor device in the form of a lateral junction field-effect transistor with an ohmic drain and source electrode.

FIG. 2 illustrates a semiconductor device in the form of a junction field-effect transistor (JFET) 20 made of α-silicon carbide. The junction field-effector transistor 20 comprises an SiC basic body 200 and an SiC epitaxial structure 201 applied thereon. In this case, the epitaxial structure 201 is produced in such a way that epitaxially undoped or only weakly doped layers 202 and p- or n-conducting layers 203 or 204, respectively, are alternately applied on the SiC basic body 200. The p-conducting layer 203 and the n-conducting layer 204 are embedded in pairs within the epitaxial structure 201. They are produced by ion implantation using boron and/or aluminum for the p-conducting layers 203 and using nitrogen for the n-conducting layers 204.

Narrow trenches for a source contact region 205, a drain contact region 206 and a gate contact region 207 are etched into the epitaxial structure 201 at least as far as the SiC basic body 200. These trenches are filled with $n^+$-doped silicon carbide for the source contact region 205 and the drain contact region 206. The trench for the gate contact region 207 is first provided with an insulating layer 208 on its wall. This can be done by thermal oxidation. Afterward, its interior is filled with $p^+$-doped silicon carbide. The trenches can be filled epitaxially in this case. The $n^+$- and $p^+$-doped silicon carbide filled into the trenches is etched back or polished away as far as the topmost undoped SiC layers 202 of the epitaxial structure 201. Application of a source electrode 209, a drain electrode 210 and a gate electrode 211 finally gives the SiC junction field-effect transistor shown in FIG. 2.

The source electrode 209 and the drain electrode 210 comprise a layer made of permalloy (NiFe) which is applied by sputtering or vapor deposition. An Ni—Al alloy is preferably applied for the gate electrode 211. These metallization layers are heat-treated at about 980° C. for the purpose of forming an ohmic contact.

We claim:

1. A semiconductor device with ohmic contact-connection, comprising:
    a semiconductor region formed of n-conducting silicon carbide;
    a largely homogeneous ohmic contact layer made of a material adjoining said semiconductor region and having a first component able to form a silicide at a process temperature of at most 1000° C., and iron; and
    a junction region extending into said semiconductor region and into said ohmic contact layer, and containing a silicide formed from said first component and the silicon of said silicon carbide and iron carbide formed from said iron and the carbon of said silicon carbide.

2. The semiconductor device according to claim 1, wherein said first component and said iron are capable of forming silicide and iron carbide respectively at a process temperature below 900° C.

3. The semiconductor device according to claim 1, having a specific contact resistance of $5 \times 10^{-7}$ Ωcm².

4. The semiconductor device according to claim 1, wherein said iron is 2% to 50% by volume of said ohmic contact layer.

5. The semiconductor device according to claim 4, wherein said iron is 10% to 30% by volume of said ohmic contact layer.

6. The semiconductor device according to claim 1, wherein said first component is a material selected from the group consisting of nickel and cobalt.

7. The semiconductor device according to claim 1, wherein said semiconductor region comprises n-conductive α-silicon carbide and said ohmic contact layer is disposed on a silicon face or a carbon face of said α-silicon carbide.

8. The semiconductor device according to claim 1, wherein said semiconductor region has a dopant concentration in a range from $10^{17}$ cm$^{-3}$ to $10^{20}$ cm$^{-3}$.

9. The semiconductor device according to claim 1, wherein said ohmic contact layer has a thickness in range from 15 nm to 200 nm.

10. The semiconductor device of claim 1, wherein a covering layer is disposed on a side of said ohmic contact layer remote from said semiconductor region.

11. The semiconductor device according to claim 10, wherein said covering layer comprises a metal.

12. The semiconductor device according to claim 11, wherein said metal is selected from the group consisting of tungsten, tantalum, and zirconium.

13. The semiconductor device according to claim 10, wherein said covering layer has a thickness in a range from 50 nm to 250 nm.

14. A method for the contact-connection of a semiconductor device, which comprises:
    applying a largely homogeneous ohmic contact layer made of a material having a first component capable of forming a silicide and iron able to form iron carbide to a semiconductor region made of n-conducting silicon carbide, the two material components being applied simultaneously, and
    subjecting the structure comprising the semiconductor region and the ohmic contact layer to a heat-treatment process with heating to a process temperature of at most 1000° C.,
    whereby a silicide is formed from the first material component and the silicon of the silicon carbide, and iron carbide is formed from the iron and the carbon of the silicon carbide, in a junction region extending into the semiconductor region and into the ohmic contact layer.

15. The method according to claim 14, wherein a component is applied by evaporation.

16. The method according to claim 14, wherein a component is applied by sputtering.

17. The method according to claim 14, wherein the structure is heat-treated at a temperature of no more than 900° C.

18. The method according to claim 17, wherein the structure is heat-treated at a temperature of approximately 850° C.

19. The method according to claim 17, wherein the process temperature is kept constant for no more than 2 hours.

20. The method according to claim 17, wherein the process temperature is kept constant for no more than 2 minutes.

21. The method according to claim 14, wherein heat treatment is carried out in absence of oxygen.

22. The method according to claim 14, wherein the iron is from 2% to 50% of the material by volume.

23. The method according to claim 22, wherein the iron is from 10% to 30% of the material by volume.

24. The method according to claim 14, wherein the first component is selected from the group consisting of nickel and cobalt.

* * * * *